(12) United States Patent  
Gu et al.

(10) Patent No.: US 11,567,221 B2  
(45) Date of Patent: Jan. 31, 2023

(54) RADIATION IMAGE DETECTOR

(71) Applicant: IRAY TECHNOLOGY COMPANY LIMITED, Shanghai (CN)

(72) Inventors: Tieer Gu, Shanghai (CN); Zhongshou Huang, Shanghai (CN)

(73) Assignee: IRAY TECHNOLOGY COMPANY LIMITED, Shanghai (CN)

( * ) Notice: Subject to any disclaimer, the term of this patent is extended or adjusted under 35 U.S.C. 154(b) by 399 days.

(21) Appl. No.: 16/936,839

(22) Filed: Jul. 23, 2020

(65) Prior Publication Data

US 2021/0223413 A1 Jul. 22, 2021

(30) Foreign Application Priority Data

Jan. 21, 2020 (CN) .......................... 202010072684.1

(51) Int. Cl.
*H01L 27/146* (2006.01)
*G01T 1/20* (2006.01)

(52) U.S. Cl.
CPC ........ *G01T 1/20181* (2020.05); *G01T 1/2002* (2013.01); *G01T 1/2018* (2013.01); *G01T 1/20185* (2020.05); *H01L 27/14607* (2013.01); *H01L 27/14625* (2013.01); *H01L 27/14627* (2013.01)

(58) Field of Classification Search
CPC . G01T 1/2002; G01T 1/2018; G01T 1/20181; G01T 1/20185; H01L 27/14607; H01L 27/14625; H01L 27/14627

See application file for complete search history.

(56) References Cited

U.S. PATENT DOCUMENTS

| | | | |
|---|---|---|---|
| 2004/0257460 A1 | 12/2004 | Kuriyama | |
| 2007/0181923 A1 | 8/2007 | Tanaka | |
| 2013/0048861 A1 | 2/2013 | Ohta et al. | |
| 2016/0099277 A1 | 4/2016 | Madhukar | |
| 2016/0356645 A1* | 12/2016 | Yoneda | H04N 5/374 |

FOREIGN PATENT DOCUMENTS

| | | |
|---|---|---|
| CN | 107195647 A | 9/2017 |
| JP | H07115183 A | 5/1995 |
| JP | 2006 049825 A | 2/2006 |

OTHER PUBLICATIONS

European Search Report dated Feb. 18, 2021 in EP 20196975.5.
Chinese Office Action dated Mar. 8, 2022 in CN 202010072684.1.

* cited by examiner

*Primary Examiner* — Mark R Gaworecki
(74) *Attorney, Agent, or Firm* — W&G Law Group

(57) ABSTRACT

Provided is a radiation image detector, including: a substrate; an optical image detector located on the substrate; and a radiation conversion layer located above the optical image detector to convert radiation into visible light. The optical image detector includes a photosensitive pixel array formed by a plurality of photosensitive pixels arranged periodically; each photosensitive pixel includes a photoelectric conversion layer which is capable of converting the visible light into electric charges. The photoelectric conversion layer includes an active region and an inactive region. The active region occupies less than 70% of the area of the photoelectric conversion layer. Each photosensitive pixel further includes a light-guide layer located between the radiation conversion layer and the photoelectric conversion layer and configured to guide the visible light to the active region.

9 Claims, 10 Drawing Sheets

RADIATION IMAGE DETECTOR

CROSS-REFERENCE TO RELATED APPLICATIONS

The present disclosure is based upon and claims the benefit of priority of Chinese Patent Application No. 202010072684.1, filed on Jan. 21, 2020, the entire content of which is incorporated herein by reference.

TECHNICAL FIELD

The present disclosure pertains generally to the technical field of radiation detectors, and more particularly, to the field of radiation image detectors.

BACKGROUND

Flat-panel X-ray image detectors have been widely used for digital radiography for digital medical diagnosis and radiation therapy. Compared with a traditional X-ray film, such a flat-panel image detector has advantages of fastness, low cost, low exposure, high image quality, etc., is convenient for data archiving, transmission and calculation, and is readily integrated into PACS (Picture Archiving and Communication Systems).

FIG. 1 is a prior art of a typical flat panel radiation image detector. As shown in FIG. 1, a radiation conversion layer 103' and a visible light image detector 102' are included. The visible light image detector 102' includes a plurality of photoelectric conversion devices (only one is illustrated). The photoelectric conversion device includes a photodiode. The photodiode includes a p-type doped layer Z1', an n-type doped layer Z2', and a semiconductor film G'. In order to efficiently collect photo-generated charges generated in the photodiode and maintain a sufficient dynamic range, that is, not to be saturated in charge storage, a sufficiently-high reverse voltage is usually applied across two ends of the photodiode (a top electrode C1' and a bottom electrode C2' as illustrated). As shown in FIG. 1, a voltage, e.g., −5V to −10V or even −15V in a case of a large amount of radiation, is applied to the top P-type doped layer Z1'. For a well-manufactured semiconductor film G', such as a hydrogenated amorphous silicon thin film a-SiH manufactured by PECVD, a reverse bias voltage of approximately 2V is sufficient for collecting photo-generated charge carriers for a-SiH film of per micron thickness. A higher voltage is mainly for a sufficiently wide dynamic range. However, a dark current of a semiconductor photodiode is mainly a dark current injected from a cathode or an anode (the top electrode C1' or the bottom electrode C2' in the figure), which increases rapidly with an increase of the bias voltage. The dark current of the photodiode may not only make an actual dynamic range, which responds to incident light, become narrower, but also cause a scatter noise for the dark current, and a false image background caused by non-uniformity of a wide range of dark current across an entire plane of the image detector.

The dark current and a photocurrent are both proportional to an area of the photodiode under normal circumstances, so it is impossible to decrease the dark current by simply reducing the area of the photodiode without deteriorating a photoelectric conversion efficiency of the photodiode. Therefore, one purpose of the present disclosure is to find a special structure or a driving method combining the special structure, which can decrease the dark current of the photodiode without reducing the photoelectric conversion efficiency of the photodiode.

SUMMARY

Embodiments of the present disclosure provide a radiation image detector, which can decrease a dark current without affecting an output amount of photoelectric conversion while improving a quality of a detected image.

An embodiment of the present disclosure provides a radiation image detector, including: a substrate; an optical image detector located on the substrate; and a radiation conversion layer located above the optical image detector to convert radiation into visible light. The optical image detector includes a photosensitive pixel array formed by a plurality of photosensitive pixels arranged periodically; each photosensitive pixel includes a photoelectric conversion layer which is capable of converting the visible light into electric charges. The photoelectric conversion layer includes an active region and an inactive region. The active region occupies less than 70% of the area of the photoelectric conversion layer. Each photosensitive pixel further includes a light-guide layer located between the radiation conversion layer and the photoelectric conversion layer and configured to guide the visible light to the active region.

The photoelectric conversion layer includes the active region and the inactive region. The light-guide layer of the photosensitive pixel guides the visible light to the active region, and the visible light emitted from the radiation conversion layer, which would otherwise be incident to the inactive region, will also be guided to the active region. In this way, the visible light emitted from the radiation conversion layer can enter, almost without any loss, the active region in which photoelectric conversion can be performed, thereby generating photocurrents and contributing to an image signal. That is, although the photoelectric conversion layer includes the inactive region, an amount of photo-generated charges that can be generated in the active region of the photoelectric conversion layer is barely decreased compared to a case in which the photoelectric conversion layer does not include the inactive region. Thus, the output amount of photoelectric conversion basically remains unchanged. Meanwhile, since all visible light is basically guided to the active region by the light-guide layer, there is almost no visible light incident to the inactive region, and thus there is no photo-generated charge carrier (i.e., electron-hole pair generated by light excitation) in the inactive region. In the embodiments of the present disclosure, an area of the inactive region of the photoelectric conversion layer is at least 30% of the area of the photoelectric conversion layer. Due to lack of one electrode for applying a voltage to the semiconductor film in this region, it is impossible to generate a dark current injected from the electrode, and it is also impossible for an external circuit to collect, through the electrode, dark charges generated in the photoelectric conversion layer and dark charges injected from the electrode. Therefore, the dark current can be decreased by at least 30% in proportion to the area.

In addition, the active contact surface is disposed in a middle region of the photoelectric conversion layer, which is far from an edge of the photoelectric conversion layer that is pixelated. Since an interface dark current generated at the edge is usually more serious than that in the center region, a structure of the embodiment can completely avoid collecting dark charges of a high current density at the edge.

The dark current is decreased, and thus the scattering noise caused by the dark current and the false image background caused by the non-uniform dark current are accordingly reduced.

BRIEF DESCRIPTION OF DRAWINGS

These and other features, aspects, and advantages of the present disclosure will become better understood when the following description is read with reference to the accompanying drawings in which like characters represent like parts throughout the drawings, wherein.

DESCRIPTION OF EMBODIMENTS

In order to make the features, aspects and advantages of the present disclosure better understood, the technical solutions of the present disclosure will be described in details below with reference to the accompanying drawings. It should be noted that the described embodiments are merely a part of implementations of the present disclosure, rather than all of the implementations or varieties based upon the concept disclosed in the present disclosure. All other embodiments obtained by those skilled in the art without creative efforts according to the embodiments of the present disclosure shall fall within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

Under a certain bias voltage, a cathode or an anode of a photoelectric conversion layer collects a current from a semiconductor and a current injected from an electrode, including a dark current and a photocurrent. For a photoelectric conversion film having a certain thickness, each of the dark current and the photocurrent is proportional to an area of the photoelectric conversion film. A smaller area of the photoelectric conversion layer will result in a smaller dark current and a smaller photocurrent, and thus the photoelectric conversion layer will have a decreased output amount of photoelectric conversion. Therefore, it is not a solution to decrease the dark current by simply decreasing the area of the photoelectric conversion layer. The present disclosure can decrease the dark current while guaranteeing the output amount of photoelectric conversion by changing a structure of a photosensitive pixel in an image detector. In this way, various disadvantages due to the dark current, such as a dynamic range, a scatter noise, and a false image background, can be alleviated, thereby improving the quality of the detected image.

Figure 1:
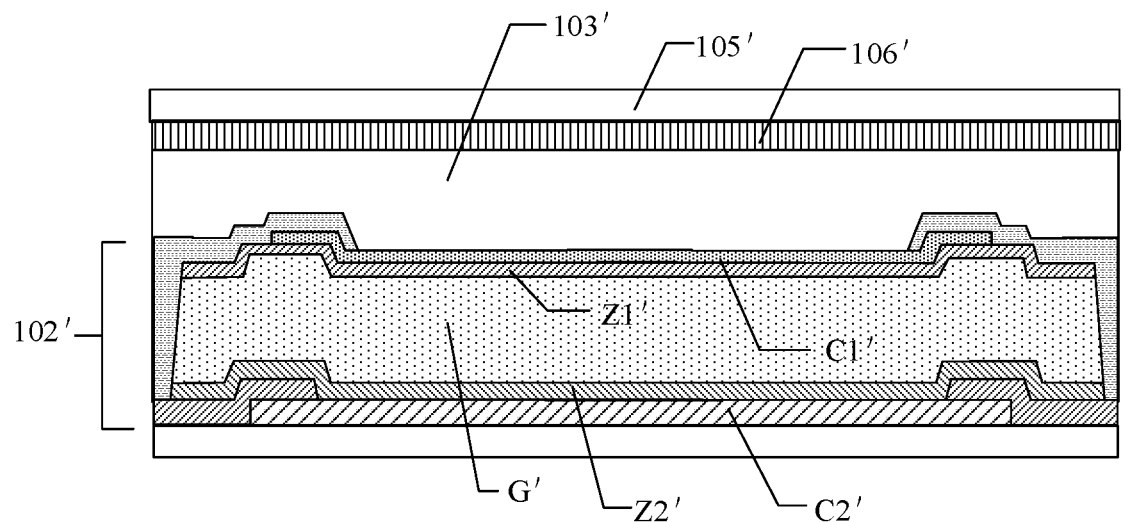
FIG. 1 is a prior art of a typical flat panel radiation image detector.
Figure 2:
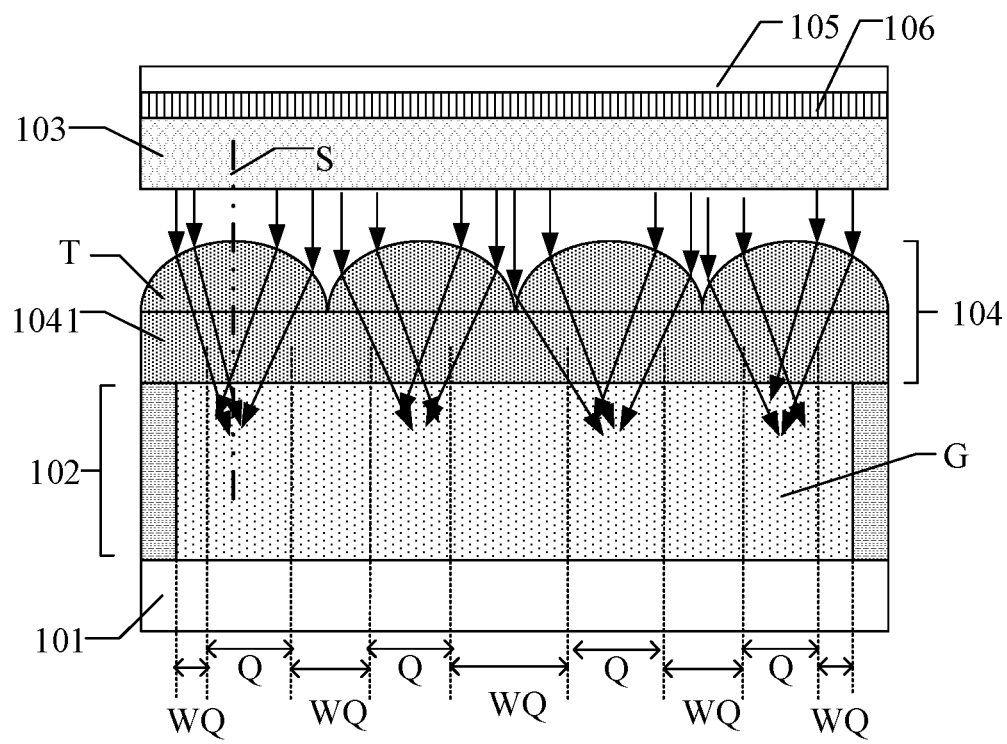
FIG. 2 is a cross-sectional view of a radiation image detector according to an embodiment of the present disclosure.

An embodiment of the present disclosure provides a radiation image detector. FIG. 2 is a cross-sectional view of a radiation image detector according to an embodiment of the present disclosure. As shown in FIG. 2, the radiation image detector includes a substrate 101. The substrate 101 may be made of a rigid material or a flexible material.

The radiation image detector further includes an optical image detector 102 located on the substrate 101. The optical image detector 102 includes a photosensitive pixel array including a plurality of photosensitive pixels arranged periodically. Moreover, adjacent photosensitive pixels are isolated from each other by etching or by means of an insulation film, thereby avoiding signal crosstalk between pixels and the interference noise of driving pulses.

In order to clearly illustrate a structure of the photosensitive pixel, only one photosensitive pixel is illustrated in FIG. 2. The photosensitive pixel includes a photoelectric conversion layer G, which is configured to convert visible light into electric charges.

The photoelectric conversion layer G of a pixel is divided into active regions Q and inactive regions WQ. The active regions Q of the photoelectric conversion layer may be a combination of interconnected or isolated regions. A total area of the active regions Q is smaller than 70% of an area of the photoelectric conversion layer G, while the remaining regions of the photoelectric conversion layer are the inactive regions WQ. The active region Q may be a region far from an edge region of the photoelectric conversion layer, thereby avoiding activation and collection of high-density dark currents in the edge region. In addition, as illustrated in the figure, the inactive regions WQ may exist in both the edge region and at positions close to a center region of the photoelectric conversion layer G. In most cases, a non-doped or lightly doped semiconductor intrinsic layer is selected as the photoelectric conversion layer G. In a photosensitive pixel, the area of the photoelectric conversion layer G is an area of an orthographic projection of the intrinsic layer onto the substrate 101.

The photoelectric conversion layer G is configured to convert visible light into electric charges, and in order to generate an electronic image, the electric charges need to be collected to form an electrical signal. Therefore, a voltage signals need to be applied to an upper end and a lower end of the photoelectric conversion layer G respectively through the anode and the cathode, so as to achieve collection of electric charges and thus achieve the photoelectric conversion function. In this embodiment of the present disclosure, visible light is guided to the active region Q to generate electron-hole pairs, which are separated by an electric field in the active region Q. Then, electrons are collected by the anode and holes are collected by the cathode, thereby generating a photocurrent. In addition, in an embodiment of the present disclosure, the photosensitive pixel includes the anode, the cathode, and a p-type doped layer and an n-type doped layer on a surface of the photoelectric conversion layer (typically, a semiconductor layer). In this case, in the active region Q, the anode and the cathode are respectively in contact with the photoelectric conversion layer through the respective doped layers, a voltage is applied and photo-generated charge carriers are collected, thereby achieving the photoelectric conversion function.

In this embodiment of the present disclosure, the inactive region WQ refers to a region in which no photoelectric conversion is performed. In this embodiment of the present disclosure, when the photosensitive pixel includes the anode, the cathode, the respective doped layers and the photoelectric conversion layer, since the inactive region WQ lacks at least one of the anode or the cathode, dark charges generated in the inactive region WQ will not either be separated by the electric field in this region or be collected by the electrode or an external circuit. In order to achieve this effect, an insulation layer may be inserted between the doped layer and the photoelectric conversion layer or between the doped layer and the electrode, so that at least one of the anode or the cathode cannot be connected to the photoelectric conversion layer to achieve collection of changes. In this way, the inactive region WQ is finally formed.

It should be noted that FIG. 2 simply illustrates the active regions Q and the inactive regions WQ, and does not illustrate a specific structure of the photosensitive pixel in the active regions Q and the inactive regions WQ. The specific structure will be described in the following specific embodiments.

The radiation image detector further includes a radiation conversion layer 103 located on a side of the optical image detector 102 facing away from the substrate 101, and the radiation conversion layer 103 is configured to convert radiation into visible light. The radiation may be X-rays having energy ranging from 1 KeV to several hundred KeV, or γ (Gamma)-rays which may have higher energy exceeding 1 MeV in energy distribution. The radiation conversion layer 103 includes scintillator or phosphors, such as cesium iodide (doped with Thallium CsI (Tl), or CdWO4 or GOS (Gd2O2S:Pr).

The photosensitive pixel further includes a light-guide layer 104 located between the radiation conversion layer 103 and the photoelectric conversion layer G, and the light-guide layer 104 is configured to guide visible light to the active regions Q. A structure of the light-guide layer 104 shown in FIG. 2 is merely shown for illustration, aiming to illustrate a light path along which the visible light emitted from the radiation conversion layer 103 is guided to the active regions Q after passing through the light-guide layer 104. Here, most of the visible light emitted from the radiation conversion layer 103 towards the inactive regions WQ will also be guided to the active regions Q. In this embodiment of the present disclosure, the light-guide layer 104 is a light-guide layer that is pixelated. That is, in the photosensitive pixel array, each photosensitive pixel includes a light-guide layer. As a simple and easy-to-manufacture pixel structure, the light-guide layer of each photosensitive pixel has a same structure.

As shown in FIG. 2, the radiation image detector further includes a reflective layer 106 and a cover plate 105. The reflective layer 106 is located on a side of the radiation conversion layer 103 facing away from the optical image detector 102, and the cover plate 105 is located on a side of the reflective layer 106 facing away from the radiation conversion layer 103. The cover plate 105 is made of light mass materials including a material that can be easily penetrated by radiation, such as a carbon fiber plate or an aluminum alloy plate. The reflective layer 106 is made of materials including a material with high reflection in visible light, such as aluminum or silver in the forms of thin film or nano particles.

For the radiation image detector provided by this embodiment of the present disclosure, the photoelectric conversion layer includes active regions and inactive regions. The light-guide layer of the photosensitive pixel guides visible light to the active regions, and most of the visible light emitted from the radiation conversion layer towards the inactive regions is also guided to the active regions. This can ensure that the visible light emitted from the radiation conversion layer can enter, almost without any loss, the active regions in which the photoelectric conversion can be performed, thereby generating photocurrents and contributing to the image signal. That is, although the photoelectric conversion layer includes the inactive regions, an amount of photo-generated charges that can be generated by the active regions of the photoelectric conversion layer is barely decreased compared to the photoelectric conversion layer that does not include the inactive regions. Therefore, the output amount of photoelectric conversion of the photoelectric conversion layer can also be interpreted as the overall photoelectric conversion efficiency, which is basically unchanged. Meanwhile, since the inactive region lacks at least one electrode, which is one of the cathode or the anode, there is no dark current injected from the electrode, and dark charges generated in the photoelectric conversion layer cannot be collected. In this embodiment of the present disclosure, the inactive regions of the photoelectric conversion layer occupies at least 30% of an area of the photoelectric conversion layer. That is, in this embodiment, the dark current can be decreased by at least 30% of the area of the photoelectric conversion layer without affecting a total output amount of photoelectric conversion.

The radiation image detector provided by this embodiment of the present disclosure further includes active contact surfaces formed by direct contact with the active regions of the photoelectric conversion layer. A total area of the active contact surfaces is smaller than or equal to 70% of the area of the photoelectric conversion layer. In one photosensitive pixel, the active contact surfaces completely cover the active regions, so as to ensure that light spots incident to the photoelectric conversion layer are all covered by the active contact surfaces. The photosensitive pixel further includes an anode and a cathode that are located on two sides of the photoelectric conversion layer, so that the photo-generated charges generated in the active regions of the photoelectric conversion layer can be collected. The active contact surfaces may be arranged on a side of the photovoltaic conversion layer where the anode is located, or on a side of the photovoltaic conversion layer where the cathode is located, or respectively on two sides of the photovoltaic conversion layer where the anode and the cathode are respectively located. For the radiation image detector provided by this embodiment of the present disclosure, the photosensitive pixel further includes a top electrode, a bottom electrode, a top doped semiconductor layer, and a bottom doped semiconductor layer. The top doped semiconductor layer is located on a side of the photoelectric conversion layer close to the radiation conversion layer, and the top electrode is located on a side of the top doped semiconductor layer facing away from the photoelectric conversion layer. The bottom doped semiconductor layer is located on a side of the photoelectric conversion layer facing away from the radiation conversion layer, and the bottom electrode is located on a side of the bottom doped semiconductor layer facing away from the photoelectric conversion layer. In an example, when the top electrode is the anode of the photosensitive pixel, the top doped semiconductor layer is a p-type doped layer, the bottom electrode is the cathode of the photosensitive pixel, and the bottom doped semiconductor layer is an n-type doped layer. When the top electrode is the cathode of the photosensitive pixel, the top doped semiconductor layer is an n-type doped layer, the bottom electrode is the anode of the photosensitive pixel, and the bottom doped semiconductor layer is a p-type doped layer. In the present disclosure, the active contact surface is defined by the minimum area of the doped layer, and can be interpreted as the minimum area in contact with the doped layer and the photoelectric conversion layer connected to the electrode. The active region is determined by an area and a position of the light spot, which is collected by a light-collecting structure and is then incident to the corresponding area of the active contact surface in the photoelectric conversion layer. Two conditions are required to achieve photoelectric conversion in the active regions, including one condition that there is incident light, and another condition that there are upper and lower electrodes for applying voltages at two ends.

A structure of the photosensitive pixel will be described in the following with reference to a specific embodiment. With the following description, meanings of the active contact surface, the active region and the inactive region defined in this embodiment of the present disclosure as well as the surface in direct contact with the inactive region can be more clearly illustrated.

Figure 3:
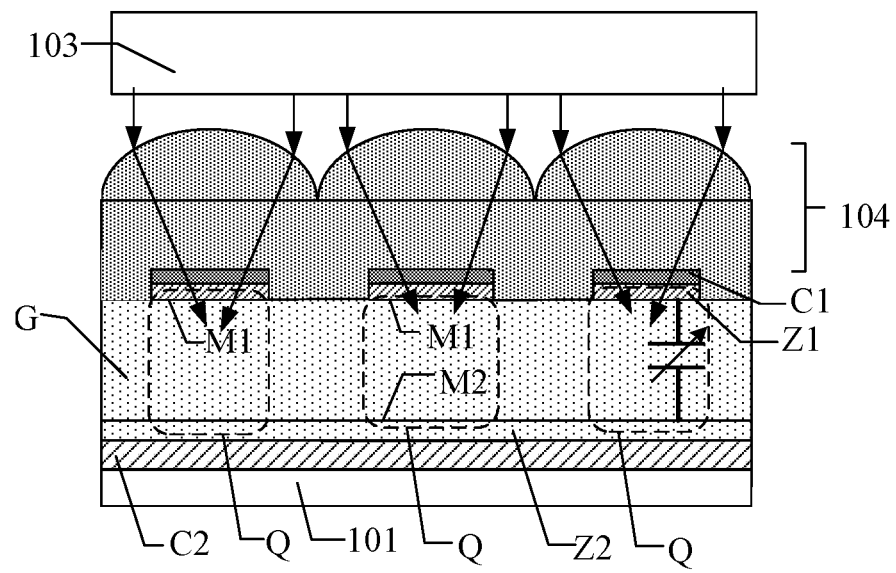
FIG. 3 is a schematic illustrating a portion of a radiation image detector according to an embodiment of the present disclosure.

FIG. 3 is a schematic illustrating a portion of a radiation image detector according to an embodiment of the present disclosure. In FIG. 3, the top electrode C1, the bottom electrode C2, the top doped semiconductor layer Z1, the bottom doped semiconductor layer Z2, and the photoelectric conversion layer G of the photosensitive pixel are illustrated. The top electrode C1 is in direct contact with the top doped semiconductor layer Z1. The top doped semiconductor layer Z1 is in contact with a surface of the photoelectric conversion layer G facing the radiation conversion layer 103 to form a top contact surface M1, which is the active contact surface. That is, the active region Q of the photoelectric conversion layer G is in direct contact with at least a part of the top doped semiconductor layer Z1. Meanwhile, the bottom electrode C2 is in direct contact with the bottom doped semiconductor layer Z2, and the bottom doped semiconductor layer Z2 is in direct contact with the photoelectric conversion layer G to form the bottom contact surface M2. In this way, the photoelectric conversion function of the active region Q is achieved. In this embodiment, both the top electrode C1 and the top doped semiconductor layer Z1 are etched to form corresponding openings. The top electrode C1 and the top doped semiconductor layer Z1 are not in direct contact with the inactive region of the photoelectric conversion layer G (the inactive region is not labeled in the figure, and is defined as the region of the photoelectric conversion layer other than the active are Q). The visible light is guided to the active region Q by the light-guide layer 104. In an example, in the edge region of the photoelectric conversion layer G, in order to prevent electric leakage at the edge, the top electrode C1 shrinks by a certain distance relative to the photoelectric conversion layer G, and an edge of the bottom electrode C2 is also covered by an insulation layer. In this way, the inactive region also exists in the edge region, and the light-guide layer 104 can also guide the visible light, which would otherwise be incident to the edge region, to the active region Q.

Figure 4:
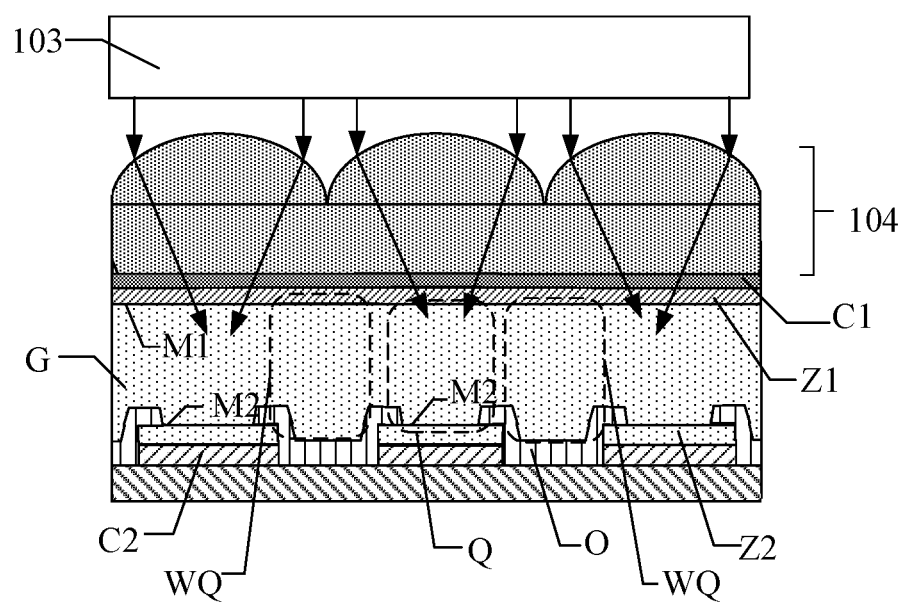
FIG. 4 is a schematic illustrating a portion of a radiation image detector according to another embodiment of the present disclosure.

FIG. 3 merely illustrates a case in which the top doped semiconductor layer is in contact with the surface of the photoelectric conversion layer facing the radiation conversion layer to form the top contact surface, which is the active contact surface. In another embodiment, the bottom doped semiconductor layer is in contact with a surface of the photoelectric conversion layer facing away from the radiation conversion layer to form a bottom contact surface, which is the active contact surface. FIG. 4 is a schematic illustrating a portion of a radiation image detector according to another embodiment of the present disclosure. As shown in FIG. 4, the bottom electrode C2 and the bottom doped semiconductor layer Z2 may be etched to form openings O. In this case, at positions corresponding to the openings O, the photoelectric conversion layer G cannot be in contact with and connected to the electrode, thereby forming the inactive regions WQ of the photoelectric conversion layer G. Here, the openings O may be filled with an insulation material.

In the embodiment corresponding to FIG. 3, the top electrode and the top doped semiconductor layer corresponding to the inactive region of the photoelectric conversion layer are etched away. In the embodiment corresponding to FIG. 4, the bottom electrode and the bottom doped semiconductor layer corresponding to the inactive regions of the photoelectric conversion layer are etched away. In the two embodiments, due to the light collecting effect of the light-guide layer, the visible light is guided to the active regions, thereby ensuring that a total amount of photo-generated charges of the photoelectric conversion layer remains basically unchanged. However, since a part of one of the top electrode or the bottom electrode is etched away, an overlapping area between the top electrode and the bottom electrode is decreased. As a result, an equivalent total capacitance formed between the top electrode and the bottom electrode of the photosensitive pixel will be correspondingly decreased. That is, in this embodiment of the present disclosure, the dark current can be decreased while an equivalent capacitance can be correspondingly adjusted. That is, the equivalent capacitance of the photosensitive pixel can be adjusted independently of the output amount of photoelectric conversion.

For a conventional radiation image detector, more photo-generated charges can be obtained by increasing a dimension of the photosensitive pixel, i.e., increasing an area of the photoelectric conversion layer. However, a larger area of the photosensitive pixel results in a larger capacitance. Although a larger capacitance can achieve a larger charge capacity and a larger dynamic range, it also results in a greater charge/discharge delay and a larger switching noise. This contradictory result obviously limits optimization of photoelectric detection characteristics of the radiation image detector. In this embodiment of the present disclosure, a degree of freedom for optimizing the design of the optical detector performance is increased, and the equivalent capacitance can be designed according to requirements so as to achieve adjustment of the equivalent capacitance. In this way, more photo-generated charges can be obtained while avoiding the charge/discharge delay and switching noise resulted from the excessively large equivalent capacitance.

Figure 5:
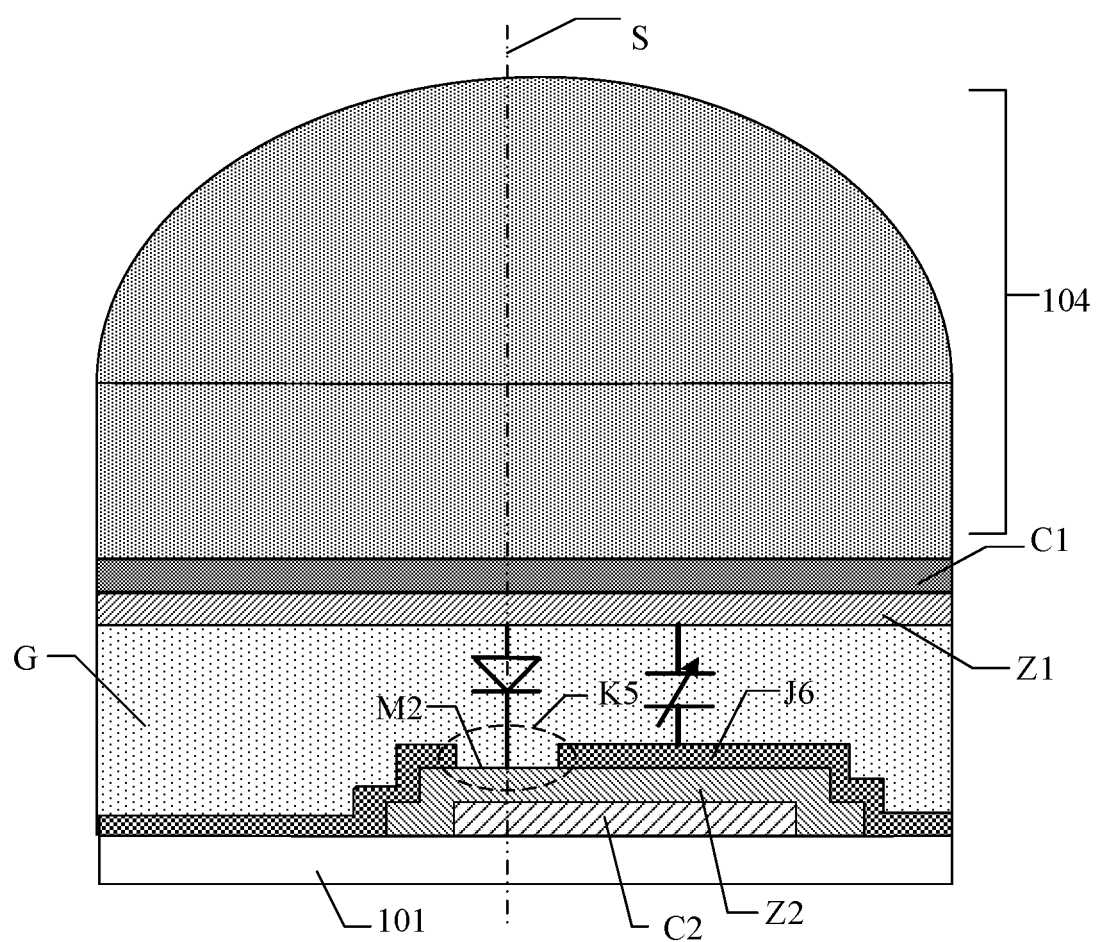
FIG. 5 is a schematic illustrating a portion of a radiation image detector according to another embodiment of the present disclosure.

An embodiment of the present disclosure provides an alternative way for adjusting the equivalent capacitance. FIG. 5 is a schematic illustrating a portion of a radiation image detector according to another embodiment of the present disclosure. FIG. 5 merely illustrates a partial area of the photosensitive pixel, and this embodiment will be illustrated by still taking the bottom contact surface being the active contact surface as an example. As shown in FIG. 5, the bottom electrode C2 and the bottom doped semiconductor layer Z2 are patterned and etched, and an insulation layer J6 is provided between the bottom doped semiconductor layer Z2 and the photoelectric conversion layer G and includes an opening K5. At a position of the opening K5, the bottom doped semiconductor layer Z2 is in contact with the photoelectric conversion layer G to form the bottom contact surface M2, which is the active contact surface. The visible light is guided to the active region of the photoelectric conversion layer G by the light-guide layer. As shown in the figure, the bottom electrode C2 that is patterned is an asymmetric structure with respect to the opening K5 (that is, with respect to the active region), so that the equivalent capacitance between the top electrode C1 and the bottom electrode C2 can be adjusted by adjusting a relative position between the bottom electrode C2 and the opening K5.

The embodiment shown in FIG. 3 illustrates that the electrode and the corresponding doped layer are etched away at the active contact surface side, so that a surface of the photoelectric conversion layer at the active contact surface side, except the active contact surface, cannot be in contact with and connected to the electrode, thereby forming the inactive region of the photoelectric conversion layer. In addition to the above-described manner of forming the inactive region, an embodiment of the present disclosure may also provide a scheme in which a partial region on the surface of the photoelectric conversion layer at the active contact surface side is covered by an insulation layer, so that such partial region of the photoelectric conversion layer cannot be in contact with and connected to the electrode, thereby forming the inactive region of the photoelectric conversion layer.

Figure 6:
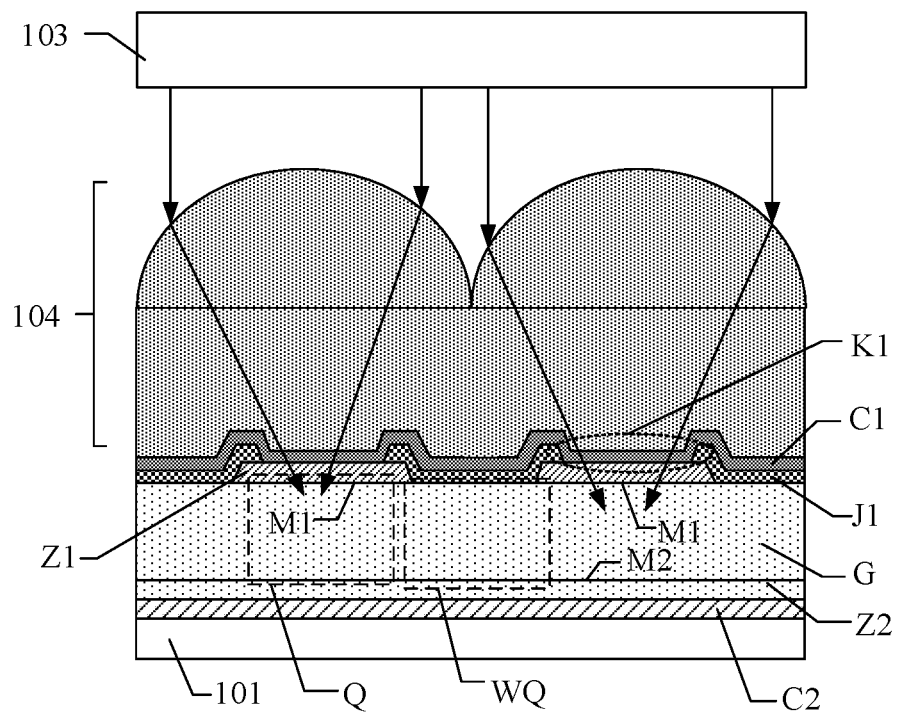
FIG. 6 is a schematic illustrating a portion of a radiation image detector according to another embodiment of the present disclosure.

FIG. 6 is a schematic illustrating a portion of a radiation image detector according to another embodiment of the present disclosure. FIG. 6 merely illustrates a partial area of the photosensitive pixel, and this embodiment will be illustrated by still taking the top contact surface M1 being the active contact surface as an example. As shown in FIG. 6, at a position corresponding to the inactive region WQ, the top doped semiconductor layer Z1 is etched away, and the inactive region WQ of the photoelectric conversion layer G is covered by the insulation layer J1. That is, due to lack of one electrode that applies a voltage to the photoelectric conversion layer G in the inactive region, there is no dark current injected from the electrode. In this embodiment, the surface of the photoelectric conversion layer G at the active contact surface side, except the active contact surface, is covered by the insulation layer J1. The insulation layer J1 includes at least one opening K1, and the top electrode C1 is connected to the top doped semiconductor layer Z1 at a position of the opening K1. Meanwhile, a contact surface between the top doped semiconductor layer Z1 and the photoelectric conversion layer G at the position of the opening K1 is the active contact surface. In this embodiment, the opening K1 corresponds to the active region Q of the photoelectric conversion layer G. When the visible light is guided to the active region Q by the light-guide layer, the visible light does not pass through the insulation layer J1. This can avoid multiple reflections of the visible light in the insulation layer, thereby guaranteeing a transmittance for the visible light.

In a manufacturing process, after the bottom electrode C2, the bottom doped semiconductor layer Z2, and the photoelectric conversion layer G are sequentially formed, the top doped semiconductor layer Z1 is formed on the photoelectric conversion layer G. Then, the top doped semiconductor layer Z1 is etched so that a part of the surface of the photoelectric conversion layer G is in direct contact with the top doped semiconductor layer Z1, while the remaining part of the photoelectric conversion layer G is not in contact with the top doped semiconductor layer Z1. Then, the insulation layer J1 is formed, and a part of the surface of the photoelectric conversion layer G is covered by the insulation layer J1. Then, the insulation layer J1 is etched to form the opening K1, which exposes the top doped semiconductor layer Z1. Then, the top electrode C1 is formed, and the top electrode C1 is connected to the top doped semiconductor layer Z1 at the position of the opening K1. Therefore, the opening K1 corresponds to the active region Q of the photoelectric conversion layer G, and the inactive region WQ of the photoelectric conversion layer G is covered by the insulation layer J1.

Figure 7:
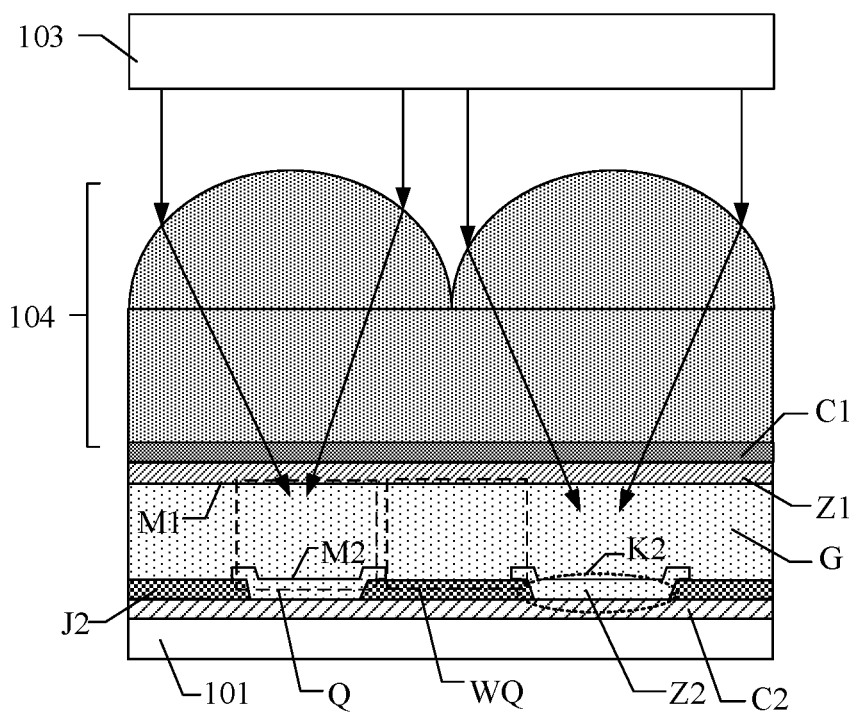
FIG. 7 is a schematic illustrating a portion of a radiation image detector according to another embodiment of the present disclosure.

FIG. 6 merely illustrates an example in which the top doped semiconductor layer is in contact with a surface of the photoelectric conversion layer facing the radiation conversion layer to form the top contact surface, which serves as the active contact surface. FIG. 7 is a schematic illustrating a portion of a radiation image detector according to another embodiment of the present disclosure. As shown in FIG. 7, the bottom doped semiconductor layer Z2 is in contact with the surface of the photoelectric conversion layer G to form the bottom contact surface M2, which serves as the active contact surface. During the manufacturing process, the insulation layer J2 may be formed between the bottom electrode C2 and the bottom doped semiconductor layer Z2. That is, after the manufacturing process of the bottom electrode C2 is completed, the insulation layer J2 is formed on the bottom electrode C2. Then, the opening K2 is formed in the insulation layer J2, which exposes the bottom electrode C2.

Then, the bottom doped semiconductor layer Z2 is formed, which is filled in the opening K2, and then at the position of the opening K2, the bottom doped semiconductor layer Z2 is connected to the bottom electrode C2. Then, the photoelectric conversion layer G is formed on the bottom doped semiconductor layer Z2, and then at the position of the opening K2, the photoelectric conversion layer G is in contact with the bottom doped semiconductor layer Z2 to form the bottom contact surface M2 (i.e., the active contact surface in this solution). A region of the photoelectric conversion layer G corresponding to the position of the opening K2 is the active region Q. At other positions, the photoelectric conversion layer G is in contact with the insulation layer J2. That is, the surface of the photoelectric conversion layer at the active contact surface side, except the active contact surface, is covered by the insulation layer J2, thereby forming the inactive region WQ of the photoelectric conversion layer G.

Figure 8:
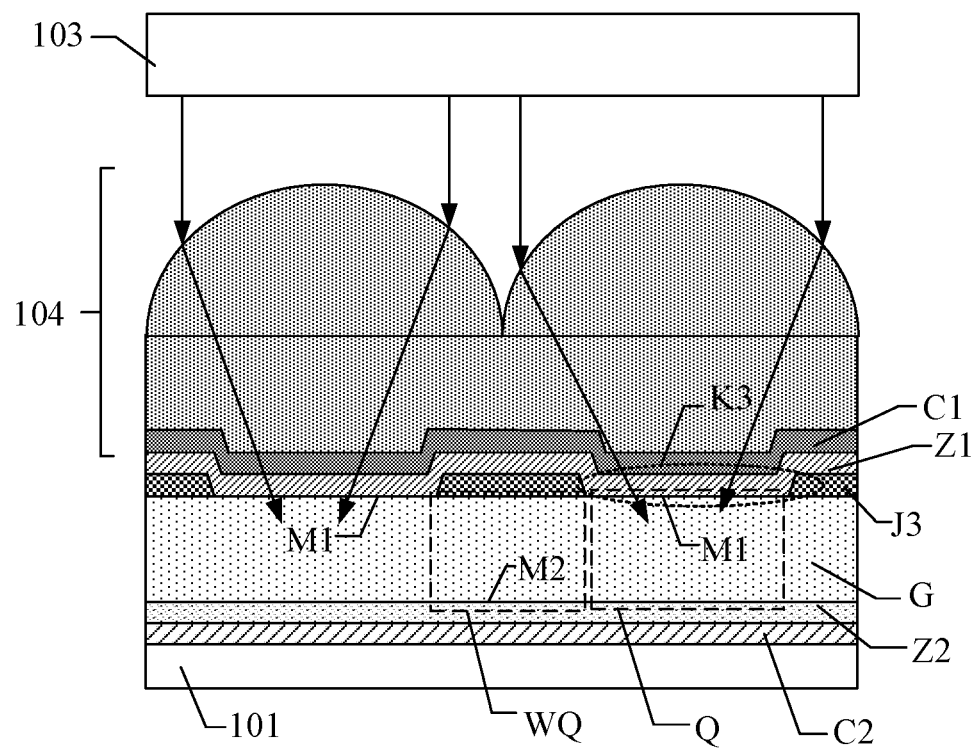
FIG. 8 is a schematic illustrating a portion of a photosensitive pixel of a radiation image detector according to another embodiment of the present disclosure.

FIG. 8 is a schematic illustrating a portion of a photosensitive pixel of a radiation image detector according to another embodiment of the present disclosure. FIG. 8 merely illustrates a partial area of the photosensitive pixel, and this embodiment will be illustrated by still taking the top contact surface M1 being the active contact surface as an example. As shown in FIG. 8, both the top electrode C1 and the top doped semiconductor layer Z1 are continues. At the position corresponding to the inactive region WQ, an insulation layer J3 is further provided between the top doped semiconductor layer Z1 and the photoelectric conversion layer G. The insulation layer J3 is in direct contact with the photoelectric conversion layer. Therefore, due to lack of one electrode for applying a voltage to the photoelectric conversion layer G in this region, there is no dark current injected from the electrode and dark charges cannot be collected. That is, in this embodiment, the surface of the photoelectric conversion layer G at the active contact surface side, except the active contact surface, is covered by the insulation layer J3. Moreover, the insulation layer J3 includes at least one opening K3, and the top doped semiconductor layer Z1 is in contact with the photoelectric conversion layer G at the position of the opening K3 to form the active contact surface. In this embodiment, the opening K3 corresponds to the active region Q of the photoelectric conversion layer G.

In the manufacturing process, after the bottom electrode C2, the bottom doped semiconductor layer Z2, and the photoelectric conversion layer G are sequentially formed, the insulation layer J3 is formed on the photoelectric conversion layer G. Then, the insulation layer J3 is etched to form the opening K3, which exposes a part of the photoelectric conversion layer G. The remaining part of the surface of the photoelectric conversion layer G other than the opening K3 is covered by the insulation layer J3, and the region of the photoelectric conversion layer G covered by the insulation layer J3 forms the inactive region WQ. Then, the top doped semiconductor layer Z1 and the top electrode C1 are sequentially formed on the insulation layer J3, so that the top doped semiconductor layer Z1 is in direct contact with the photoelectric conversion layer G at the position of the opening K3. The region of the photoelectric conversion layer G corresponding to the opening K3 is the active region Q. The insulation layer J3 has a certain function in protecting the photoelectric conversion layer G. The visible light can be guided to the active region Q by the light-guide layer without passing through the insulation layer, thereby avoiding multiple reflections of the visible light in the insulation layer and thus increasing a transmittance for the visible light.

Figure 9:
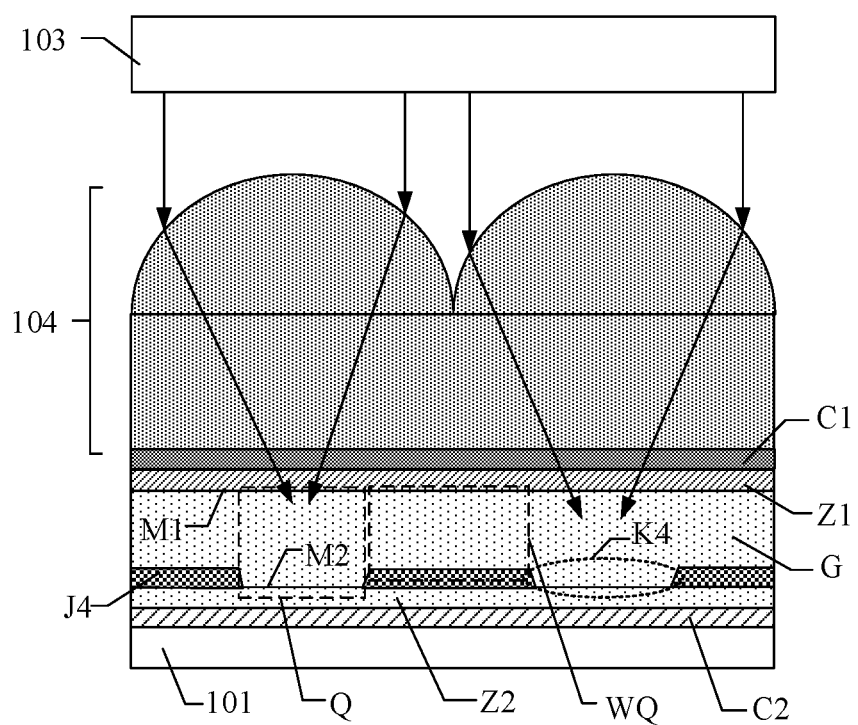
FIG. 9 is a schematic illustrating a portion of a photosensitive pixel of a radiation image detector according to another embodiment of the present disclosure.

FIG. 8 merely illustrates an example in which the top doped semiconductor layer is in contact with the surface of the photoelectric conversion layer facing the radiation conversion layer to form the top contact surface, which serves as the active contact surface. FIG. 9 is a schematic illustrating a portion of a photosensitive pixel of a radiation image detector according to another embodiment of the present disclosure. As shown in FIG. 9, the bottom doped semiconductor layer Z2 is in contact with the surface of the photoelectric conversion layer G to form the bottom contact surface M2, which serves as the active contact surface. During the manufacturing process, the insulation layer J4 may be formed above the bottom electrode C2 and the bottom doped semiconductor layer Z2. That is, after the manufacturing process of the bottom electrode C2 and the bottom doped semiconductor layer Z2 are completed sequentially, the insulation layer J4 is formed on the bottom doped semiconductor layer Z2. Then, an opening K4 is formed in the insulation layer J4, which exposes a part of the bottom doped semiconductor layer Z2. Then, the photoelectric conversion layer G is formed. At the position of the opening K4, the bottom doped semiconductor layer Z2 is in contact with the photoelectric conversion layer G to form the bottom contact surface M2 (i.e., the active contact surface in this solution). A region of the photoelectric conversion layer G corresponding to the position of the opening K4 is the active region. The part of the insulation layer J4 that is not etched is in direct contact with the photoelectric conversion layer G. The surface of the photoelectric conversion layer G at the active contact surface side, except the active contact surface, is covered by the insulation layer J4, thereby forming the inactive region WQ of the photoelectric conversion layer.

It should be noted that, in the embodiments shown in FIG. 5 to FIG. 9, due to changes in the design of the structure of the photosensitive pixel, the equivalent capacitance formed between the top electrode and the bottom electrode can also be adjusted to a certain extent, thereby increasing a degree of freedom for optimizing the design of the optical detector performance. For the principle, reference may be made to above illustration of the embodiments shown in FIG. 3 and FIG. 4, and details will not be further described herein.

In the photosensitive pixel, the maximum amount of signal charges that the photosensitive pixel can carry or process is a dynamic range of the photosensitive pixel. The dynamic range is related to total capacitance formed between the top electrode and the bottom electrode of the photosensitive pixel. In some embodiments, in order to avoid a narrow dynamic range caused by the extremely small total capacitance formed between the top electrode and the bottom electrode after the dark current is decreased, a capacitor whose dielectric is an insulation material may be provided in the photosensitive pixel, and the capacitor is in parallel connected to the photodiode. Leakage current at two ends of the capacitor can be basically ignored. The capacitor can provide additional charge storage for the photosensitive pixel, thereby increasing the storage capacitance. In this way, a sufficiently large dynamic range of the photosensitive pixel can be guaranteed, thereby ensuring that the output amount of photoelectric conversion will not be influenced.

In another embodiment, both the top contact surface and the bottom contact surface are active contact surfaces. Orthographic projections of the active contact surfaces onto the photoelectric conversion layer completely cover the active regions and have a total area smaller than or equal to 70% of the area of the photoelectric conversion layer. For the structure of the electrode and the corresponding doped layer at the active contact surface side, reference may be made to any one of FIG. 3 to FIG. 9 described above, which will not be further described with reference to the accompanying drawings herein.

As an example, in the embodiments shown in FIG. 3 to FIG. 9, one of the top doped semiconductor layer and the bottom doped semiconductor layer is a p-type doped layer, and the other one is an n-type doped layer.

As an example, in this embodiment of the present disclosure, at least one of the top doped semiconductor layer and the bottom doped semiconductor layer includes an alloy junction of metal and semiconductor. For example, a thickness of the alloy junction is smaller than or equal to 50 nm. The alloy junction includes metal atoms or molecules of the electrode and semiconductor atoms or molecules of the photoelectric conversion layer. During the manufacturing process, the electrode of the photosensitive pixel is made of a metal material, and the photoelectric conversion layer is made of a semiconductor material. After the electrode is in contact with the photoelectric conversion layer, under heat treatment, metal atoms or molecules in the electrode will gradually diffuse to a semiconductor material surface to form a layer of the alloy junction. The alloy junction has potential barrier characteristics of unidirectional conduction and current reverse injection, so that cooperation of the alloy junction, the semiconductor material and the electrode can improve the photoelectric conversion performance. Replacing the conventional p-type doped layer or n-type doped layer with the alloy junction can decrease the doping process and thus simplify the manufacturing process while guaranteeing the photoelectric conversion performance of the photosensitive pixel.

Taking the embodiment shown in FIG. 6 as an example, the active contact surface is disposed at a side of the photoelectric conversion layer G facing the radiation conversion layer 103, and the bottom doped semiconductor layer Z2 includes an alloy junction. In the manufacturing process, a metal layer of the bottom electrode is formed. Then, a semiconductor material layer of the photoelectric conversion layer is formed on the metal layer of the bottom electrode. Then, heat treatment is performed on the metal layer, and atoms or molecules in the metal layer will diffuse into the semiconductor material layer to form a layer of the alloy junction on a surface of the semiconductor, thereby forming the bottom electrode and the bottom doped semiconductor layer. The bottom doped semiconductor layer is the alloy junction. Then, the top doped semiconductor layer and the top electrode are sequentially formed on the photoelectric conversion layer G.

Still taking FIG. 6 as an example, the top doped semiconductor layer Z1 includes the alloy junction. During the manufacturing process, after the bottom electrode C2, the bottom doped semiconductor layer Z2, and the photoelectric conversion layer G are sequentially formed, the insulation layer J1 is formed. Then, the insulation layer J1 is etched to form the opening K1. Then, the metal layer of the top electrode C1 is formed on the insulation layer J1, and the metal layer of the top electrode C1 is in contact with the photoelectric conversion layer G at the position of the opening K1. Then, heat treatment is performed to make the atoms or molecules in the metal layer of the top electrode C1 diffuse into the photoelectric conversion layer G, so that the alloy junction is formed at the surface of the photoelectric conversion layer G. The alloy junction serves as the top doped semiconductor layer Z1, which is connected to the top electrode C1 at the position of the opening K1. The alloy junction serves as the doped layer, so that the doping process can be reduced.

In another embodiment, the top electrode C1 may include a transparent electrode formed by materials such as metal oxide. The metal oxide may include $SnO_2$ (tin oxide) or ITO (indium tin oxide). The top electrode is in contact with the photoelectric conversion layer at its surface facing the radiation conversion layer, and allows light photons, which are generated in the radiation conversion layer, to pass through.

Figure 10:
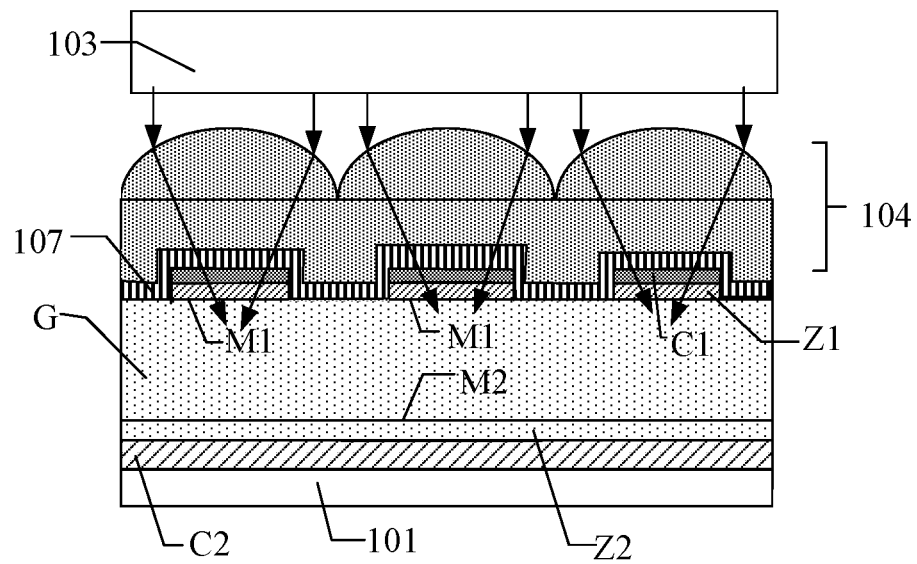
FIG. 10 is a schematic illustrating a portion of a radiation image detector according to another embodiment of the present disclosure.

Further, the radiation image detector further includes a protective layer, which is configured to protect the photosensitive pixel that is pixelated in the manufacturing process of the light-guide layer. The structure shown in FIG. 3 will be illustrated by way of an example. FIG. 10 is a schematic illustrating a portion of a radiation image detector according to another embodiment of the present disclosure. As shown in FIG. 10, the protective layer 107 is located on a side of the photosensitive pixel close to the light-guide layer 104, and the protective layer includes a silicon nitride thin film or a silicon oxide thin film. The protective layer can prevent the manufacturing material and manufacturing process applied during the manufacturing process of the light-guide layer from adversely affecting the semiconductor layer or the electrode of the photosensitive pixel. For example, the protective layer can isolate moisture in the air and gas volatilized from the manufacturing material of the light-guide layer. The protective layer can be made by a plasma enhanced chemical vapor deposition (PECVD) process.

In an optional manufacturing process, the light-guide layer is made of an organic material. First, one organic material layer is formed on the photosensitive pixel. Then, an island of the light-guide layer is formed by a process of graphic etching or a process similar to imprinting. Then, a solvent in the organic material layer is volatilized by UV irradiation or high-temperature treatment, so that the light-guide layer is hardened and shaped. In the manufacturing process described above, the gas volatilized from the organic material layer may have a degraded effect on film layers in the photosensitive pixel. With the design of the protective layer, the organic material layer can be isolated from the photosensitive pixel, thereby achieving a protection effect on the photosensitive pixel.

In an embodiment, a refractive index of the protective layer is greater than a refractive index of the light-guide layer and smaller than a refractive index of the top electrode. During the manufacturing process of the protective layer, the refractive index of the protective layer can be adjusted by adjusting conditions of the vapor deposition film forming process of the protective layer, such as a content of incorporated oxygen, nitrogen or methane gas, or plasma power, etc. In this way, reflectivity of the visible light at an interface between the light-guide layer and the protective layer and at an interface between the protective layer and the top electrode can be decreased, thereby increasing the transmittance for the visible light, and thus increasing utilization of the visible light by the photosensitive pixel.

In a specific embodiment, the refractive index of the protective layer is 1.75, the refractive index of the light-guide layer is 1.5, and the refractive index of the top electrode is 2.0. Through experimental analysis, when the protective layer is not provided between the light-guide layer and the top electrode, the reflectance of visible light at the interface between the light-guide layer and the top electrode is approximately 2%. With the protective layer, the overall reflectance of visible light is approximately 0.9%.

Therefore, with the protective layer, the reflectance is significantly decreased, and correspondingly, the light transmittance is significantly increased. Thus, the design of the protective layer can significantly increase utilization of visible light.

Further, with reference to the embodiment show in FIG. 2, the light-guide layer 104 includes at least one convex lens T. An optical axis S of the convex lens T is perpendicular to the active region Q, and the convex lens T is configured to guide visible light from the radiation conversion layer 104 to the active region Q. In this embodiment of the present disclosure, the visible light is guided to the active region by a light collecting effect of the convex lens, thereby ensuring that the visible light emitted from the radiation conversion layer can reach, almost without any loss, the active region where photoelectric conversion can be performed. In this way, photocurrent is generated to contribute to the image signal. Meanwhile, due to lack of at least one electrode for applying a voltage to the photoelectric conversion layer in the inactive region, there is no dark current injected from the electrode, and it is impossible for an external circuit to collect, through the electrode, dark charges generated in the photoelectric conversion layer and dark charges injected from the electrode. Therefore, the dark current is decreased to a greater extent, thereby alleviating a scatter noise and a false image background caused by the dark current.

The convex lens structure in the light-guide layer may be formed using a process similar to imprinting. A mold having a structure reverse to the structure of the convex lens is formed based on a shape of the convex lens in the light-guide layer, and the convex lens is formed by a process similar to imprinting. First, the shape of the convex lens is imprinted on an organic material layer through the mold. Then, a part of the solvent in the organic material layer is evaporated by UV irradiation, so as to achieve partial curing of the convex lens structure. Then, the mold is separated and the remaining solvent is further evaporated, so that the convex lens is hardened and shaped.

The convex lens structure in the light-guide layer may also be formed by etching. First, the island of the convex lens is formed by etching. Then, by baking at a high temperature and relying on fluidity of the organic material at a high temperature, an edge of the island of the convex lens naturally flows to form a curved shape. Finally, the remaining solvent in the organic material is evaporated, so that the convex lens structure is finally hardened and shaped.

With further reference to FIG. 2, the light-guide layer further includes a light-guiding base layer 1041, and the light-guiding base layer 1041 and the convex lens T may be made of a same material. The light-guiding base layer 1041 can extend a propagation path of visible light, thereby ensuring that visible light can be incident to the active region Q of the photoelectric conversion layer G after being refracted at the surface of the convex lens T. The light-guiding base layer 1041 may be manufactured separately or together with the structure of the convex lens T. In a manufacturing method, first, a thick organic material layer is formed on the photosensitive pixel. Then, a high-temperature treatment is performed to harden the organic material layer to form the light-guiding base layer. The high-temperature treatment may be, for example, baking for one hour. Then, a same organic material layer is formed on the light-guiding base layer that has been hardened. Then, the structure of the convex lens in the light-guide layer is manufactured using any one of the two manufacturing processes described above.

In some embodiments, the active region includes N active subregions, and the light-guide layer includes N convex lenses, where N is an integer greater than or equal to 2. The optical axis of each convex lens is perpendicular to a corresponding active subregion, and each convex lens is configured to guide visible light to the corresponding active subregion. In this embodiment of the present disclosure, the light-guide layer is a light-guide layer that is pixelated. That is, each photosensitive pixel corresponds to one light-guide layer. In other words, each photosensitive pixel corresponds to N convex lenses. A number of the active regions can be selected based on actual design requirements. When the area of the photoelectric conversion layer is fixed, a sum of a total area of the active regions and a total area of the inactive regions is equal to the area of the photoelectric conversion layer, so that an area of the inactive region can be adjusted based on a design of the number of the active subregions. Thus, the dark current can be greatly decreased.

Figure 11:
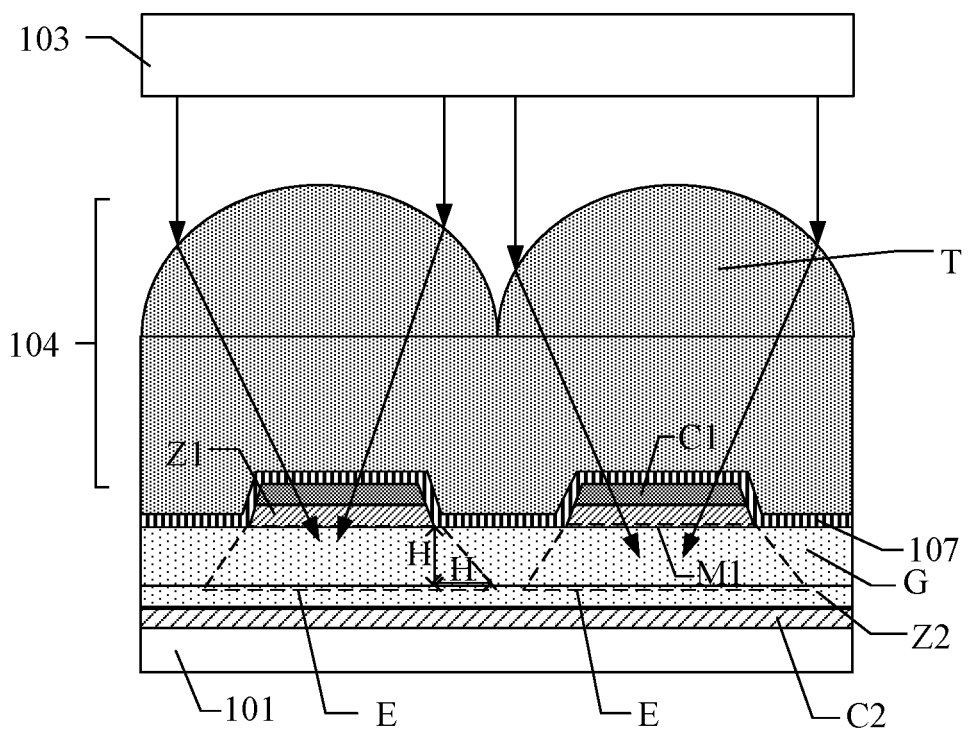
FIG. 11 is a schematic illustrating a portion of a radiation image detector according to another embodiment of the present disclosure.

In addition, in this embodiment of the present disclosure, the dark current can be reduced without affecting the output amount of photoelectric conversion, and the scattering noise and the false image background caused by the dark current can be decreased. Moreover, in this embodiment of the present disclosure, photo-generated charge carriers can be efficiently collected. FIG. 11 is a schematic illustrating a portion of a radiation image detector according to another embodiment of the present disclosure. The cross-sectional view shown in FIG. 11 illustrates two active subregions (not labeled in the figure) and two convex lenses T corresponding thereto. In an example, the top doped semiconductor layer Z1 is in contact with the photoelectric conversion layer G to form the top contact surface M1, which serves as the active contact surface. As illustrated, in the first contact layer M1 formed by one active subregion contacting the top doped semiconductor layer Z1, one active subregion corresponds to one space electric field region E. A range of the space electric field region E is defined by an upper surface, a lower surface and a virtual side surface. The upper surface is defined as the top contact surface M1 formed by one active subregion contacting the top doped semiconductor layer Z1. The lower surface is defined as a surface formed by extending an area of an orthographic projection of the upper surface onto the surface of the photoelectric conversion layer G facing the bottom doped semiconductor layer Z2 by approximately a width H, where the width H is equal to the thickness of the photoelectric conversion layer G. The virtual side surface is defined as a surface that connects the upper surface with the lower surface (since the actual photoelectric conversion layer is complete without being etched, the side surface is not an interface formed by the two materials and thus is referred to the virtual side surface). A space region formed by the upper surface, the lower surface and the virtual side surface is the space electric field region E. When a voltage is respectively applied to the top electrode and the bottom electrode, a sufficiently high space electric field intensity will be generated in this region. In this case, after visible light is guided to this region, the generated photo-generated electron-hole pair can be efficiently separated and collected.

Figure 12:
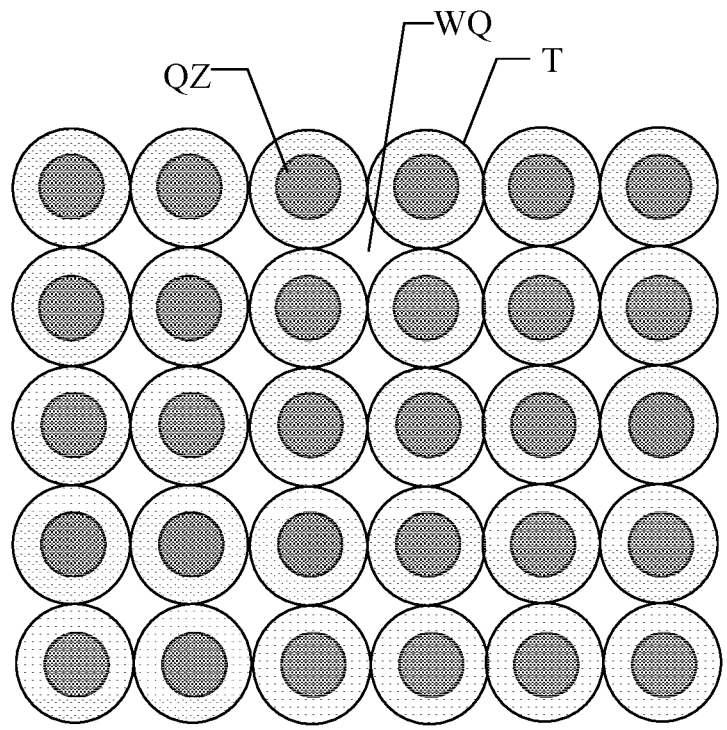
FIG. 12 is a top view of a portion of a radiation image detector according to another embodiment of the present disclosure.

FIG. 12 is a top view of a portion of a radiation image detector according to another embodiment of the present disclosure. FIG. 12 merely illustrates a top view of a structure of a photosensitive pixel. The active region includes a plurality of active subregion QZ. Each active subregion QZ corresponds to one convex lens T. The active subregion QZ is substantially circular. In this embodiment, the active subregions QZ are arranged in an array, and the convex lenses T corresponding to the active subregions QZ are also arranged in an array. The visible light is guided to the corresponding active subregion QZ by the light collecting effect of the convex lens T. Regions other than the active subregions QZ are the inactive regions WQ. In this way, the area of the inactive regions WQ can be greatly increased, thereby greatly decreasing the dark current.

Figure 13:
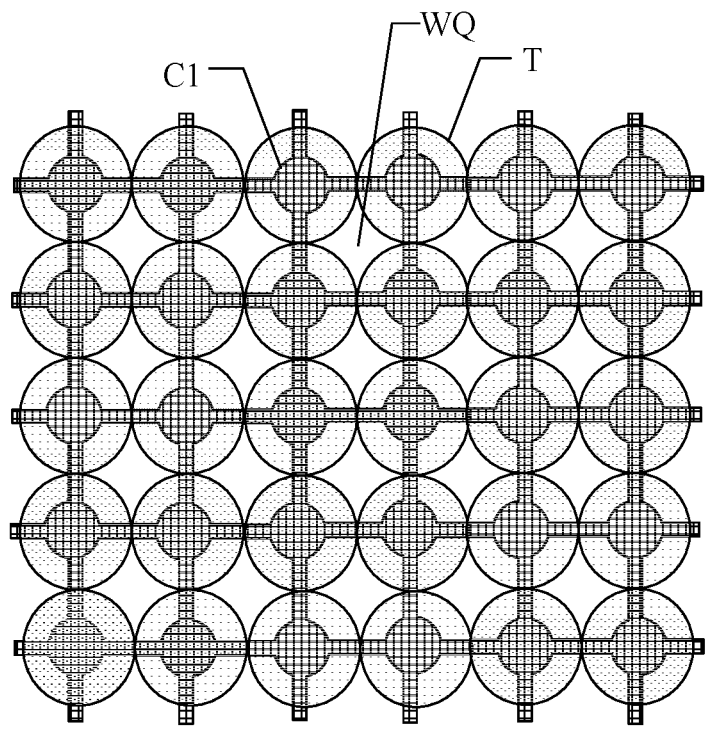
FIG. 13 is a top view of a portion of a radiation image detector according to another embodiment of the present disclosure.

FIG. 13 is a top view of a portion of a radiation image detector according to another embodiment of the present disclosure. Further, this embodiment will be better understood by combining FIG. 12 with FIG. 13. FIG. 13 merely illustrates a shape of the top electrode C1. The top electrode C1 connects the top doped semiconductor layers Z1 in the active subregions QZ in parallel and provides an external bias voltage to the photoelectric conversion layer G, so that a plurality of active subregions QZ at the active contact surface side can apply voltage signals at the same time. The cross-sectional diagram in this embodiment can be understood by referring to FIG. 6 described above, which will not be further illustrated with reference to accompanying drawings herein.

In another embodiment, when the bottom contact surface formed by the bottom doped semiconductor layer contacting the surface of the photoelectric conversion layer facing away from the radiation conversion layer serves as the active contact surface, the bottom electrode connects bottom doped semiconductor layers in the active subregions in parallel and provides an external bias voltage to the photoelectric conversion layer, which will not be further illustrated with reference to accompanying drawings.

Figure 14:
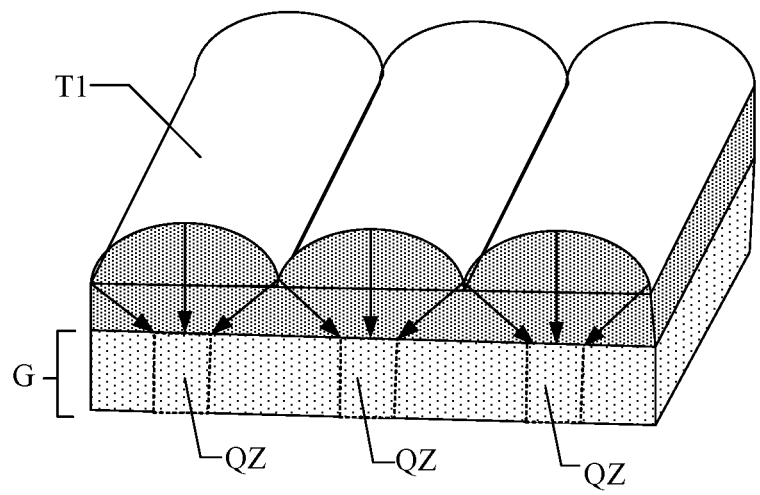
FIG. 14 is a top side view of a portion of a radiation image detector according to another embodiment of the present disclosure.

FIG. 14 is a top side view of a portion of a radiation image detector according to another embodiment of the present disclosure. FIG. 14 is merely a simplified illustration. The convex lens is a one-dimensional curved columnar convex lens T1, and a center line of the cylinder is parallel to the radiation image detector. The center line of the columnar convex lens can be understood based on definitions in the related art, which will not be further described herein. A region between two adjacent active subregions QZ is the inactive region of photoelectric conversion layer G (not labeled in the figure). The columnar convex lens T1 can guide the visible light to the active subregion QZ of the photoelectric conversion layer G, so that the visible light emitted from the radiation conversion layer can reach, almost without any loss, the active region of the photoelectric conversion layer, thereby generating photocurrents for contributing to the image signal and thus ensuring that the output amount of photoelectric conversion basically remains unchanged. Meanwhile, there is basically no visible light incident to the inactive regions, and there is no photo-generated charge carrier in the inactive regions. Moreover, due to lack of at least one electrode for applying a voltage to the photoelectric conversion layer in the inactive regions, there is no dark current injected from the electrode, and it is impossible for an external circuit to collect, through the electrode, dark charges generated in the semiconductor and dark charges injected from the electrode. Therefore, the dark current is decreased to a greater extent, thereby alleviating a scattering noise and a false image background caused by the dark current.

Figure 15:
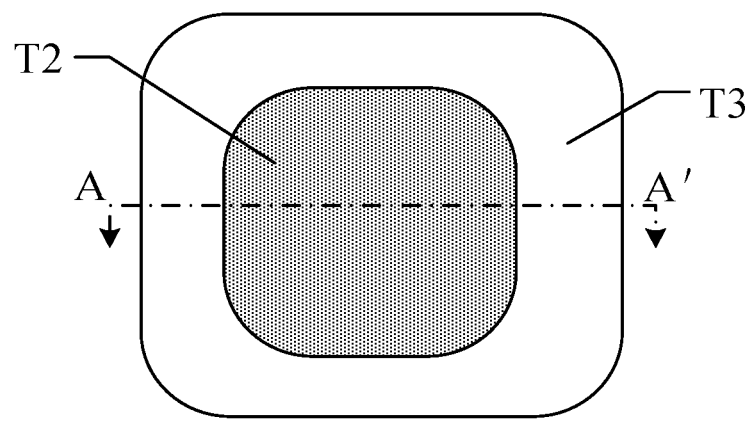
FIG. 15 is a top view of a portion of a radiation image detector according to another embodiment of the present disclosure.
Figure 16:
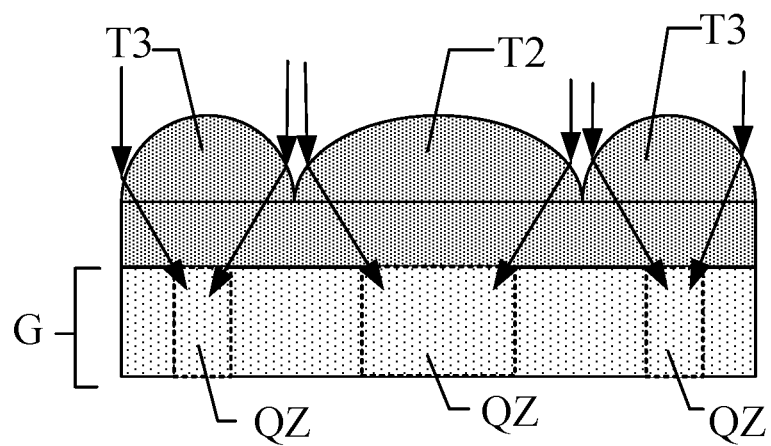
FIG. 16 is a cross-sectional view along line A-A' shown in FIG. 15.

FIG. 15 is a top view of a portion of a radiation image detector according to another embodiment of the present disclosure. FIG. 16 is a cross-sectional view along line A-A' shown in FIG. 15. In an embodiment, with reference to FIG. 15 and FIG. 16, the convex lenses include a two-dimensional curved convex lens T2 and at least one one-dimensional curved ring-shaped columnar convex lens T3. The ring-shaped columnar convex lens T3 surrounds the two-dimensional curved convex lens T2. A columnar center line of the ring-shaped columnar convex lens T3 is parallel to the radiation image detector. The columnar center line of the ring-shaped columnar convex lens T3 can be understood based on definitions in the related art, which will not be further described herein. The corresponding active subregions QZ is illustrated in the figure. The ring-shaped columnar convex lens T3 can guide the visible light, which would be otherwise incident to the edge area of the photoelectric conversion layer G, to the active subregions QZ. For a photosensitive pixel, the photosensitive pixel includes a center region and an edge region. In order to avoid electric leakage in the edge region, the top electrode in the edge region will shrink by a certain distance relative to the photoelectric conversion layer, and the edge of the bottom electrode will be covered by the insulation layer. Thus, when a voltage is respectively applied to the top electrode and the bottom electrode, the electric field intensity formed in the edge region is very weak. When visible light is incident to the edge region, electrons and holes generated in the edge region cannot be actively collected, which may cause image smearing, image instability, or background noise, thereby affecting the quality of the detected image. The ring-shaped columnar convex lens designed in this embodiment can guide the visible light in the edge region to the active subregion and thus actively decrease the visible light incident to the edge region, thereby further alleviating image smearing, image instability or background noise and thus improving the image quality. In addition, in this embodiment, the active contact surface is disposed in the middle region of the photoelectric conversion layer, which is far from the edge. Since an interface dark current generated at the edge is usually more serious than that in the center region, the structure of this embodiment can completely avoid collecting dark charges of a high current density at the edge.

It should be noted that, FIG. 14 and FIG. 16 are merely for illustrating the structure of the corresponding convex lenses, and the electrode and doped layer corresponding to the active regions and the inactive regions are not illustrated. The structure of the convex lenses shown in FIG. 14 and FIG. 16 can be applied to any embodiment shown in FIG. 3 to FIG. 11 described above.

Figure 17:
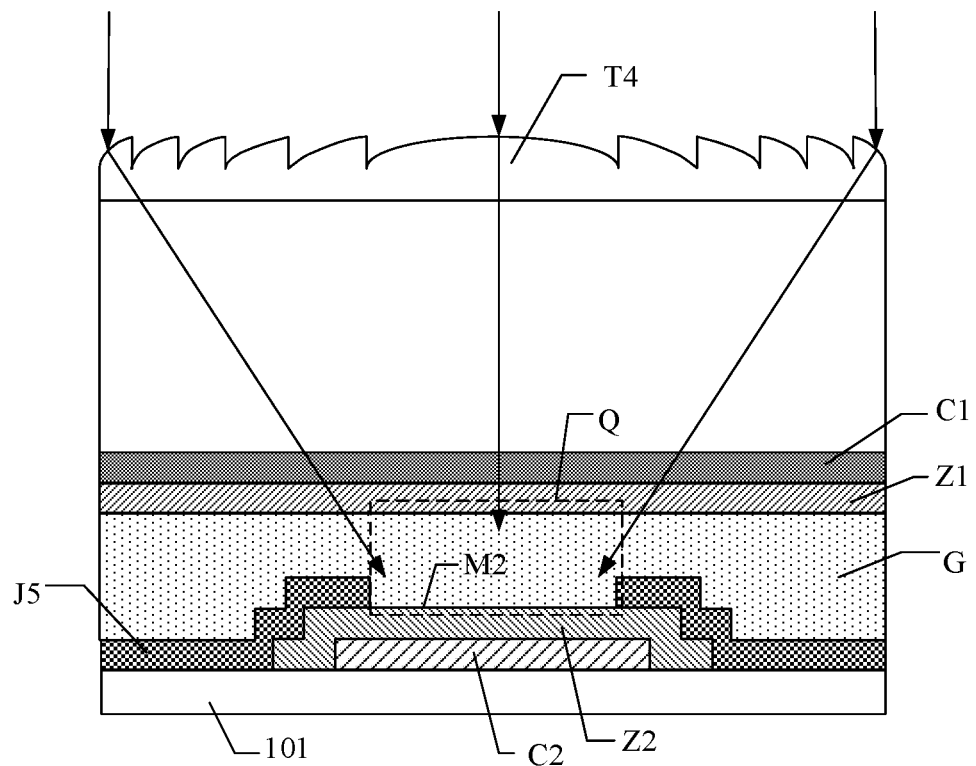
FIG. 17 is a schematic illustrating a portion of a radiation image detector according to another embodiment of the present disclosure.

In an embodiment, the light-guide layer includes at least one Fresnel lens. FIG. 17 is a schematic illustrating a portion of a radiation image detector according to another embodiment of the present disclosure. As shown in FIG. 17, as an example, the bottom doped semiconductor layer Z2 is in contact with the photoelectric conversion layer G to form the bottom contact surface M2, which serves as the active contact surface. The surface of the photoelectric conversion layer G at the active contact surface side, except the active contact surface, is covered by an insulation layer J5. The light-guide layer includes at least one Fresnel lens T4. An optical axis of the Fresnel lens T4 is perpendicular to the active region Q, and the Fresnel lens T4 can guide the visible light from the radiation conversion layer to the active region Q. The design using the Fresnel lens can actively decrease the height of the convex lens, thereby reducing difficulty of the process and an overall height of the photosensitive pixel. It should be noted that the design of the Fresnel lens can be applied to any of the embodiments described above.

In an embodiment, in order to output an electrical signal collected by the photosensitive pixel to an external circuit for processing, the radiation image detector further includes a plurality of scan lines and a plurality of data lines. In a photosensitive pixel array, a plurality of photosensitive pixels are arranged as pixel rows in a row direction and as pixels columns in a column direction. One scan line is electrically connected to all photosensitive pixels in one pixel row, and one data line is electrically connected to all photosensitive pixels in one pixel column.

Figure 18:
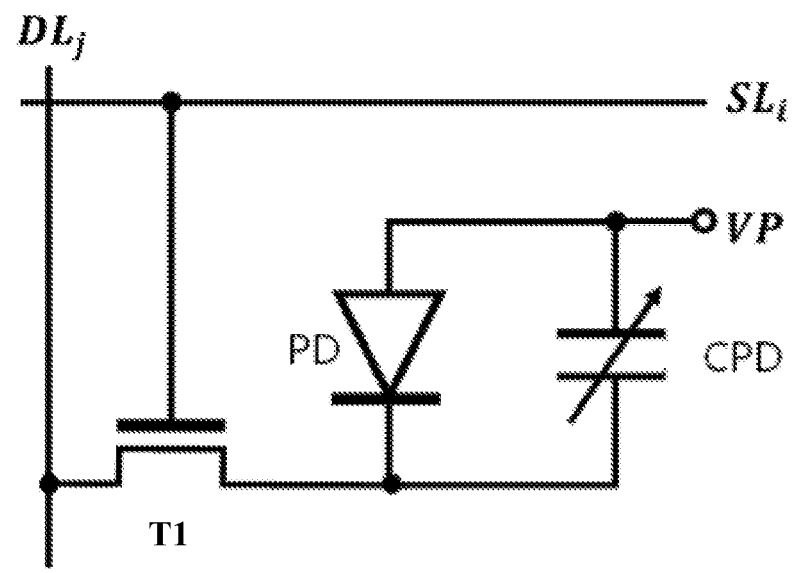
FIG. 18 is a schematic illustrating an equivalent circuit of a photosensitive pixel of a radiation image detector according to an embodiment of the present disclosure.

FIG. 18 is a schematic illustrating an equivalent circuit of a photosensitive pixel of a radiation image detector according to an embodiment of the present disclosure. As shown in FIG. 18, PD represents the photoelectric conversion layer G of the photosensitive pixel described above in the embodiments of the present disclosure, CPD represents an equivalent capacitance CPD formed between the top electrode C1 and the bottom electrode C2 of the photosensitive pixel, and VP represents a voltage between the top electrode C1 and the bottom electrode C2 of the photosensitive pixel. M1 is a switching diode of the photosensitive pixel, and a gate electrode of M1 is connected to a row scan line $SL_i$. An output signal is transmitted to an external circuit through a data line $DL_j$. Here, i denotes a serial number of a row in which the scan line is located, or it can be construed as the scan line connected to an $i^{th}$ row of pixels of the photosensitive pixel array; and j represents a serial number of a column in which the data line is located, or it can be construed as the data line connected to $j^{th}$ column of pixels of the photosensitive pixel array. According to the present disclosure, the total area of active regions of the photoelectric conversion layer is set to be smaller than 70% of the area of the photoelectric conversion layer, and the visible light is guided to the active regions by the light-guide layer, so that the dark current is decreased without decreasing the output amount of photoelectric conversion. Meanwhile, according to the present disclosure, the equivalent capacitance formed between the top electrode and the bottom electrode can be independently adjusted, that is, the equivalent capacitance formed between the top electrode and the bottom electrode may be a variable capacitance. The embodiments of the present disclosure can bring additional design and driving freedoms to applications corresponding to different images.

Figure 19:
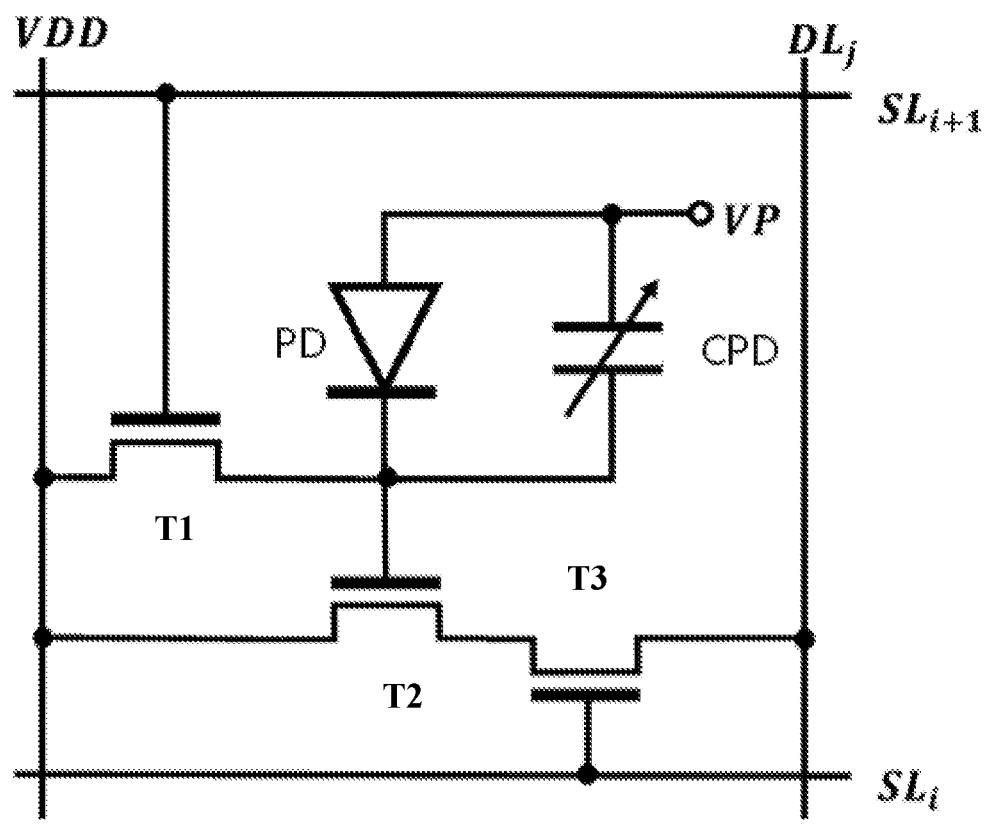
FIG. 19 is a schematic illustrating an amplifying circuit of a radiation image detector according to an embodiment of the present disclosure.

Further, in an embodiment of the present disclosure, the photosensitive pixel further includes an internal amplifying circuit. FIG. 19 is a schematic illustrating a pixel amplifying circuit of a radiation image detector according to an embodiment of the present disclosure. As shown in FIG. 19, the amplifying circuit at least includes an amplifying transistor T2, a reset transistor T1, and a switching transistor T3. PD represents the photoelectric conversion layer G of the photosensitive pixel as described above in the embodiments of the present disclosure, CPD represents an equivalent capacitance CPD formed between the top electrode C1 and the bottom electrode C2 of the photosensitive pixel, and VP represents a voltage between the top electrode C1 and the bottom electrode C2 of the photosensitive pixel. The amplifying transistor T2 includes a gate electrode, and the gate electrode is connected to a source electrode of the reset transistor T1 and is connected to the top electrode or the bottom electrode of the photosensitive pixel directly or through other electrode. The amplifying transistor T2 includes a drain electrode connected to a first voltage signal line VDD. The amplifying transistor T2 is configured to convert collected photo-generated charges into a signal voltage or a signal current, which is then readout periodically by an external circuit or readout chip. The switching transistor T3 includes a gate electrode connected to an $i^{th}$ row of scan lines $SL_i$, a source electrode electrically connected to a source electrode of the amplifying transistor T2, and a drain electrode connected to a $j^{th}$ data line $DL_j$. When the switching transistor T3 is turned on, the amplifying transistor T2 converts the collected photo-generated charges into a signal voltage or a signal current, which is then readout periodically by an external circuit or readout chip. The reset transistor T1 includes a gate electrode connected to an $(i+1)^{th}$ row of scan lines $SL_{i+1}$, a top electrode (which may be a drain electrode) electrically connected to the gate electrode of the amplifying transistor T2, and a bottom electrode (which may be a source electrode) electrically connected to the first voltage signal line VDD. The reset transistor T1 is configured to periodically reset a potential of the gate electrode of the amplifying transistor T2.

In the related art, since the gate electrode of the amplifying transistor is electrically connected to the top electrode or the bottom electrode of the photosensitive pixel, after the reset transistor resets the gate electrode of the amplifying transistor, thermal noise in a channel of the reset transistor may cause a random change in the amount of charges in the photosensitive pixel. Such random change in the amount of charges is proportional to a square root of a gate capacitance, and becomes switching noise.

Through the description of the embodiments of the present disclosure, the improved design of the structure of the photosensitive pixel in the present disclosure can actively decrease the dark current as well as the equivalent capacitance. In the amplifying circuit shown in FIG. 19, the smaller capacitance coupled to the gate electrode of the amplifying transistor leads to the higher converted signal voltage for a same amount of photo-generated charges, i.e., the larger output signal current. Meanwhile, the smaller capacitance leads to the smaller switching noise caused by the thermal noise in the channel of the switching transistor. Therefore, applying the structure of the photosensitive pixel according to the embodiments of the present disclosure into the amplifying circuit can decrease the dark current and increase the signal-to-noise ratio.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:
1. A radiation image detector, comprising:
   a substrate;
   an optical image detector located on the substrate; and
   a radiation conversion layer located above the optical image detector to convert radiation into visible light;
   wherein the optical image detector comprises a photosensitive pixel array formed by a plurality of photosensitive pixels arranged periodically; each photosensitive pixel comprises a photoelectric conversion layer which is capable of converting the visible light into electric charges; the photoelectric conversion layer comprises an active region and an inactive region, wherein the active region occupies less than 70% area of the photoelectric conversion layer; and each photosensitive pixel further comprises a light-guide layer located between the radiation conversion layer and the photoelectric conversion layer and configured to guide the visible light to the active region.

2. The radiation image detector according to claim 1, wherein each photosensitive pixel further comprises a top electrode, a bottom electrode, a top doped semiconductor layer, and a bottom doped semiconductor layer;

the top electrode is connected to the top doped semiconductor layer, and the top doped semiconductor layer is in contact with a top surface of the photoelectric conversion layer to form a top contact surface;

the bottom electrode is connected to the bottom doped semiconductor layer, and the bottom doped semiconductor layer is in contact with a bottom surface of the photoelectric conversion layer to form a bottom contact surface;

wherein, the smaller one of the top contact surface and the bottom contact surfaces, as an active contact surface, defines the active region by its projection on the photoelectric conversion layer.

3. The radiation image detector according to claim 2, wherein each photosensitive pixel further comprises an insulation layer, which covers the surface of the photoelectric conversion layer that is not in contact with the top and the bottom doped semiconductor layers.

4. The radiation image detector according to claim 3, wherein the insulation layer comprises at least one opening, that either the top or the bottom doped semiconductor layer is in contact with the photoelectric conversion layer through the opening.

5. The radiation image detector according to claim 2, wherein the top electrode comprises a transparent electrode capable of transmitting the visible light; the transparent electrode includes a metal oxide material containing $SnO_2$ or ITO.

6. The radiation image detector according to claim 1, wherein the light-guide layer comprises N convex lens, where N≥1, and the active region comprises N active subregions, wherein each convex lens is paired with one active subregion in a manner that each convex lens has its optical axis perpendicular to the corresponding active subregion and is configured to guide the visible light into the corresponding active subregion.

7. The radiation image detector according to claim 6, wherein at least one of the convex lenses has a portion of a cylindrical lens with its cylindrical axis being parallel to the radiation image detector.

8. The radiation image detector according to claim 6, wherein at least one of the convex lenses comprises a spherical or an aspherical lens that is located substantially in the center of the photoelectric conversion layer and surrounded by a cylindrical lens with its cylindrical axis being parallel to the radiation image detector.

9. The radiation image detector according to claim 1, wherein each photosensitive pixel further comprises an internal amplifying circuit, including at least an amplifying transistor and a reset transistor;

the amplifying transistor comprises a gate electrode that is connected to a source electrode of the reset transistor and is connected to the top electrode or the bottom electrode; and the amplifying transistor is configured to convert photo-generated charges into a signal voltage or signal current, which is then readout periodically by an external circuit or readout chip; and the reset transistor is configured to periodically reset a potential of the gate electrode of the amplifying transistor.

\* \* \* \* \*